(12) United States Patent
Volkerink et al.

(10) Patent No.: US 11,317,516 B2
(45) Date of Patent: Apr. 26, 2022

(54) ROLL-TO-ROLL ADDITIVE MANUFACTURING METHOD AND DEVICE

(71) Applicant: Trackonomy Systems, Inc., San Jose, CA (US)

(72) Inventors: Hendrik J Volkerink, Palo Alto, CA (US); Ajay Khoche, West San Jose, CA (US)

(*) Notice: Subject to any disclaimer, the term of this patent is extended or adjusted under 35 U.S.C. 154(b) by 0 days.

(21) Appl. No.: 17/019,833

(22) Filed: Sep. 14, 2020

(65) Prior Publication Data
US 2021/0084771 A1   Mar. 18, 2021

Related U.S. Application Data

(60) Provisional application No. 62/900,333, filed on Sep. 13, 2019.

(51) Int. Cl.
| | | |
|---|---|---|
| H05K 3/28 | (2006.01) | |
| H05K 1/03 | (2006.01) | |
| H05K 1/02 | (2006.01) | |

(52) U.S. Cl.
CPC .......... *H05K 3/28* (2013.01); *H05K 1/028* (2013.01); *H05K 1/0373* (2013.01)

(58) Field of Classification Search
CPC ........................................................ H05K 3/28
USPC ........................................................ 361/749
See application file for complete search history.

(56) References Cited

U.S. PATENT DOCUMENTS

| | | |
|---|---|---|
| 5,478,991 A | 12/1995 | Watanabe et al. |
| 5,495,250 A | 2/1996 | Ghaem et al. |
| 5,499,717 A | 3/1996 | Hayashi |
| 5,838,253 A | 11/1998 | Wurz et al. |
| 5,917,433 A | 6/1999 | Keillor |
| 6,372,342 B1 | 4/2002 | Karaoglu |
| 6,375,780 B1 | 4/2002 | Tuttle |
| 6,404,341 B1 | 6/2002 | Reid |
| 6,614,392 B2 | 9/2003 | Howard |

(Continued)

FOREIGN PATENT DOCUMENTS

| | | |
|---|---|---|
| EP | 1786143 A2 | 5/2007 |
| JP | 2008239282 A | 10/2008 |

(Continued)

OTHER PUBLICATIONS

PCT International Search Report, International Application No. PCT/US 20/50739. International search completed Nov. 18, 2020. International Search Report dated Dec. 18, 2020. pp. 1-2.

(Continued)

*Primary Examiner* — Stanley Tso

(57) ABSTRACT

A method of manufacturing a flexible laminate electronic device and the flexible laminate electronic device itself is disclosed. The method includes placing electronic components over a flexible substrate layer that includes electrical connections between ones of the electronic components. A first flexible additive layer that includes apertures is positioned to align ones of the electronic components in respective ones of the apertures. A subsequent flexible additive layer is arranged over the first flexible additive layer and the apertures are aligned around respective portions of ones of the electronic components protruding above the first flexible additive layer. A flexible cover layer is emplaced over the subsequent flexible additive layer.

20 Claims, 8 Drawing Sheets

(56) References Cited

U.S. PATENT DOCUMENTS

| | | |
|---|---|---|
| 7,009,517 B2 | 3/2006 | Wood |
| 7,020,701 B1 | 3/2006 | Gelvin et al. |
| 7,048,194 B2 | 5/2006 | Minami et al. |
| 7,177,054 B2 | 2/2007 | Silverbrook et al. |
| 7,259,030 B2 | 8/2007 | Daniels et al. |
| 7,299,990 B2 | 11/2007 | Hoshina |
| 7,321,167 B2 | 1/2008 | Zhong et al. |
| 7,405,656 B2 | 7/2008 | Olsen |
| 7,511,616 B2 | 3/2009 | Lake |
| 7,540,603 B2 | 6/2009 | Otsuki |
| 7,722,249 B2 | 5/2010 | Kim et al. |
| 7,723,733 B2 | 5/2010 | Daniels et al. |
| 7,838,844 B2 | 11/2010 | Wagner et al. |
| 7,884,727 B2 | 2/2011 | Tran |
| 8,062,735 B2 | 11/2011 | Bi et al. |
| 8,072,620 B2 | 12/2011 | Yamamoto et al. |
| 8,110,254 B1 | 2/2012 | Sharma et al. |
| 8,114,248 B2 | 2/2012 | Lee et al. |
| 8,269,633 B2 | 9/2012 | Hollander et al. |
| 8,292,173 B2 | 10/2012 | Yturralde et al. |
| 8,317,230 B2 | 11/2012 | Asay |
| 8,401,238 B2 | 3/2013 | Stahlin et al. |
| 8,448,530 B2 | 5/2013 | Leuenberger et al. |
| 8,658,455 B2 | 2/2014 | Shin et al. |
| 8,716,629 B2 | 5/2014 | Klewer et al. |
| 8,766,510 B2 | 7/2014 | Coleman et al. |
| 8,833,664 B2 | 9/2014 | Choi |
| 8,879,276 B2 | 11/2014 | Wang |
| 8,919,803 B2 | 12/2014 | Breed |
| 8,971,673 B2 | 3/2015 | Beinhocker |
| 9,015,071 B2 | 4/2015 | Breed |
| 9,070,286 B2 | 6/2015 | Moore |
| 9,137,637 B2 | 9/2015 | Bilal et al. |
| 9,159,635 B2 | 10/2015 | Elolampi et al. |
| 9,182,231 B2 | 11/2015 | Skaaksrud |
| 9,183,738 B1 | 11/2015 | Allen, Sr. et al. |
| 9,189,226 B2 | 11/2015 | Driesen et al. |
| 9,250,104 B2 | 2/2016 | Greiner et al. |
| 9,307,648 B2 | 4/2016 | Slafer |
| 9,372,123 B2 | 6/2016 | Li et al. |
| 9,419,502 B2 | 8/2016 | Veronesi et al. |
| 9,473,902 B2 | 10/2016 | Bilal et al. |
| 9,496,582 B1 | 11/2016 | Lim et al. |
| 9,538,332 B1 | 1/2017 | Medelson |
| 9,543,495 B2 | 1/2017 | Paschkewitz et al. |
| 9,543,549 B2 | 1/2017 | Bai et al. |
| 9,583,428 B2 | 2/2017 | Rafferty et al. |
| 9,632,050 B2 | 4/2017 | Zhong et al. |
| 9,643,460 B2 | 5/2017 | Peine et al. |
| 9,693,689 B2 | 7/2017 | Gannon et al. |
| 9,753,568 B2 | 9/2017 | McMillen |
| 9,781,825 B2 | 10/2017 | Farkas et al. |
| 9,824,329 B2 | 11/2017 | Stirling et al. |
| 9,860,688 B2 | 1/2018 | Kulkarni et al. |
| 9,886,015 B2 | 2/2018 | Wilson et al. |
| 10,262,255 B2 | 4/2019 | Khoche |
| 10,357,924 B2 | 7/2019 | Waldrop, III et al. |
| 10,445,634 B2 | 10/2019 | Khoche |
| 10,872,286 B2 | 12/2020 | Khoche |
| 10,885,420 B2 | 1/2021 | Khoche |
| 2003/0000128 A1 | 1/2003 | Wood |
| 2003/0018927 A1 | 1/2003 | Gadir et al. |
| 2004/0044493 A1 | 3/2004 | Coulthard |
| 2004/0131761 A1 | 7/2004 | Shakespeare |
| 2005/0211998 A1* | 9/2005 | Daniels .................. F21V 5/04 257/89 |
| 2006/0100299 A1 | 5/2006 | Malik et al. |
| 2006/0248713 A1* | 11/2006 | Vatanparast ............ H05K 3/30 29/832 |
| 2007/0049291 A1 | 3/2007 | Kim et al. |
| 2007/0095905 A1 | 5/2007 | Kadaba |
| 2007/0287473 A1 | 8/2007 | Dupray |
| 2008/0198002 A1 | 8/2008 | Bartholf et al. |
| 2008/0239282 A1 | 10/2008 | Zou et al. |
| 2009/0051530 A1 | 2/2009 | Brooks et al. |
| 2009/0072974 A1 | 3/2009 | Miyashita et al. |
| 2009/0174600 A1 | 7/2009 | Mazlum et al. |
| 2009/0192709 A1 | 7/2009 | Yonker et al. |
| 2009/0196267 A1 | 8/2009 | Walker, Sr. |
| 2010/0082870 A1 | 4/2010 | Tokuhara |
| 2010/0096181 A1 | 4/2010 | Nakamura et al. |
| 2010/0180701 A1 | 7/2010 | Daniel et al. |
| 2010/0230498 A1 | 9/2010 | Atherton |
| 2010/0299401 A1 | 11/2010 | Lloyd |
| 2011/0202159 A1 | 8/2011 | Wang |
| 2011/0218756 A1 | 9/2011 | Callsen et al. |
| 2011/0251469 A1 | 10/2011 | Varadan |
| 2012/0234586 A1 | 9/2012 | Telle et al. |
| 2012/0271540 A1 | 10/2012 | Miksa et al. |
| 2012/0278676 A1 | 11/2012 | Teraura |
| 2013/0107770 A1 | 5/2013 | Marsden et al. |
| 2013/0131980 A1 | 5/2013 | Ginsberg |
| 2013/0250357 A1 | 9/2013 | Yu |
| 2014/0014403 A1 | 1/2014 | Miller et al. |
| 2014/0240088 A1 | 8/2014 | Robinette et al. |
| 2014/0265915 A1 | 9/2014 | Huang et al. |
| 2014/0268780 A1 | 9/2014 | Wang et al. |
| 2014/0274139 A1 | 9/2014 | Bilal et al. |
| 2014/0317406 A1 | 10/2014 | Lewis et al. |
| 2014/0362890 A1 | 12/2014 | Qian |
| 2015/0154531 A1 | 6/2015 | Skaaksrud |
| 2015/0324745 A1 | 11/2015 | Goodall et al. |
| 2015/0349667 A1 | 12/2015 | Andosca et al. |
| 2015/0354973 A1 | 12/2015 | Wang et al. |
| 2015/0382154 A1 | 12/2015 | Bilal et al. |
| 2016/0011074 A1 | 1/2016 | Mian et al. |
| 2016/0026213 A1 | 1/2016 | Li et al. |
| 2016/0147353 A1 | 5/2016 | Filiz et al. |
| 2016/0205509 A1 | 7/2016 | Hopcraft et al. |
| 2016/0233927 A1 | 8/2016 | Wu |
| 2016/0270215 A1 | 9/2016 | Goto |
| 2016/0322283 A1* | 11/2016 | McMahon .......... H01L 21/0206 |
| 2016/0370210 A1 | 12/2016 | Kapusta et al. |
| 2016/0377440 A1 | 12/2016 | Dorum |
| 2017/0017872 A1 | 1/2017 | Kato et al. |
| 2017/0025547 A1 | 1/2017 | Cho et al. |
| 2017/0039666 A1 | 2/2017 | Kuersten et al. |
| 2017/0079144 A1 | 3/2017 | Coleman et al. |
| 2017/0083857 A1 | 3/2017 | Barton |
| 2017/0161679 A1 | 6/2017 | Stingel et al. |
| 2017/0337405 A1 | 11/2017 | Schutz |
| 2018/0003507 A1 | 1/2018 | Arslan et al. |
| 2018/0046964 A1 | 2/2018 | Leoni et al. |
| 2018/0104609 A1 | 4/2018 | Musliner |
| 2018/0110450 A1 | 4/2018 | Lamego et al. |
| 2018/0165568 A1 | 6/2018 | Khoche |
| 2018/0326487 A1 | 11/2018 | Casper et al. |
| 2019/0272458 A1* | 9/2019 | Khoche .................. B32B 37/12 |

FOREIGN PATENT DOCUMENTS

| | | |
|---|---|---|
| JP | 20029230500 A | 10/2009 |
| JP | 2011090670 A | 5/2011 |
| JP | 2012141995 A | 7/2012 |
| WO | 2014195756 A1 | 12/2014 |
| WO | 2016120628 A1 | 8/2016 |
| WO | 2017046699 A1 | 3/2017 |
| WO | 2017100707 A3 | 7/2017 |
| WO | 2018053309 A1 | 3/2018 |

OTHER PUBLICATIONS

Mva Raju Bahubalendruni, HCL Technologies, Opticom, Optimization of Composite Laminate Stack-Up Sequence Using Differential Evolution Algorithm, Conference Paper, Oct. 2010, 35 pages.

Palavesam et al, Roll-to-Roll Processing of Film Substrates for Hybrid Integrated Flexible Electronics, 2018 IOP Publishing Ltd., Flexible and Printed Electronics, 2018, 19 pages.

Park et al., Improvement of Cross-Machine Directional Thickness Deviation for Uniform Pressure-Sensitive Adhesive Layer in Roll-to-Roll Slot-Die Coating Process, International Journal of Precision Engineering and Manufacturing, vol. 16, No. 5, pp. 937-943, May 2015.

(56) References Cited

OTHER PUBLICATIONS

Dementyev, SensorTape: Modular and Programmable 3D-Aware Dense Sensor Network on a Tape, In Proc. of UIST 2015.

Griffin et al., Adhesive RFID Sensor Patch for Monitoring of Sweat Electrolytes, in IEEE Transactionson Bio-Medical Engineering, Nov. 2014.

Pyo et al., Development of a Map Matching Method Using the Multiple Hypothesis Technique, 2001 IEEE.

Liu, Survey of Wireless Based Indoor Localization Technologies, arXiV:1709.01015v2 [cs.N1] Mar. 14, 2018.

Cheung et al., Least Squares Algorithms for Time-of-Arrival-Based Mobile Location, IEEE Transactions on Signal Processing, vol. 52, No. 4, Apr. 2004, pp. 1121-1128.

Frazier et al., Fully-Drawn Carbon-Based Chemical Sensors on Organic and Inorganic Surfaces, Lab Chip. Oct. 21, 2014; 14(20): 4059-4066. doi:10.1039/c4lc00864b.

Alsheikh et al., Machine Learning in Wireless Sensor Networks: Algorithms, Strategies, and Applications, arXiv:1405.4463v2 [cs. NI] Mar. 19, 2015.

Farooqui et al., A Paper Based Ink Jet Printed Real Time Location Tracking TAB, 2013 IEEE MTT-S International Microwave Symposium Digest (MTT).

Gong Ei Al., Low-Cost Sensor Tape for Environment Sensing Based on Roll-to-Roll Manufacturing Process, In Proc, of IEEE Sensors 2012.

Olyazadeh, Least Square Approach on Indoor Positioning Measurement Techniques, 2012.

Wimmer et al., Modular and Deformable Touch-Sensitive Surfaces Based on Time Domain Reflectometry, UIST 11 Proceedings of the 24th Annual ACM Symposium on User Interface Software and Technology, pp. 517-526, Santa Barbara,CA, USA, Oct. 16-19, 2011.

Olberding et al., A Cuttable Multi-Touch Sensor, Proceeding UIST, 13 Proceedings of the 26th Annual ACM Symposium on User Interface Software and Technology, pp. 245-254, St. Andrews, Scotland, United Kingdom, Oct. 8-11, 2013.

Zhang et al., Deep Neural Networks for Wireless Localization in Indoor and Outdoor Environments, Neurocomputing 194 (2016), pp. 279-287.

PCT Application No. PCT/US2019/042488, International Search report and Written Opinion, dated Nov. 5, 2019.

PCT Application No. PCT/US2019/046588, International Preliminary Report on Patentability, dated Feb. 16, 2021.

Shen et al., A Mobility Framework to Improve Heterogeneous Wireless Network Services, Inderscience Enterprises Ltd., 2011.

Iacono, Wireless Sensor Network Protocols, Universidad De Mendoza, Argentina, 2011.

Matin et al., Overview of Wireless Sensor Network, Intech, 2012 (http://doi.org/10.5772/49376.1).

Cimino et al., Wireless Communication, Identification, and Sensing Technologies Enabling Integrated Logistics: A Study in the Harbor Environment, Research Gate, Oct. 2015 (https://www.researchgate.net/?publication/283117890_Wireless_Communication_Identification_and_Sensing_Technologies_Enabling_Integrated_Logistics_A_Study_in_the_Harbor_Environment).

PCT Application No. PCT/US2018/064855, International Search Report and Written Opinion, dated Mar. 29, 2019.

PCT Application No. PCT/US2018/064919, Written Opinion, dated Apr. 5, 2019, 7 pages. 7.

* cited by examiner

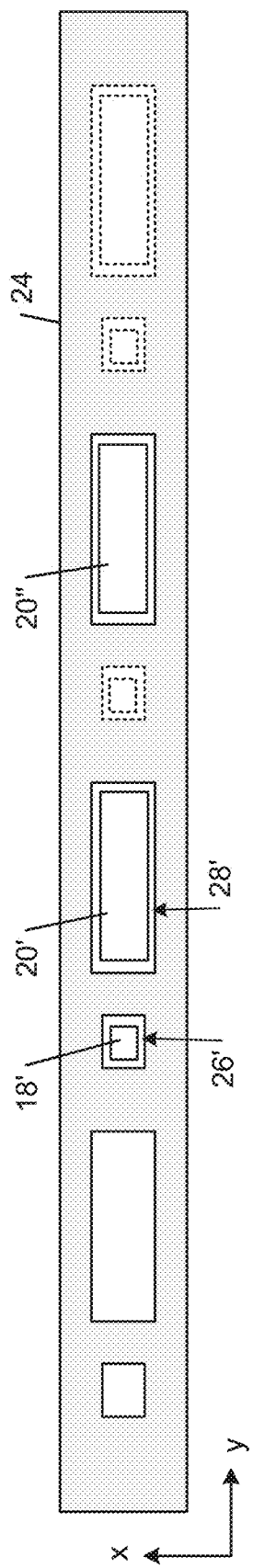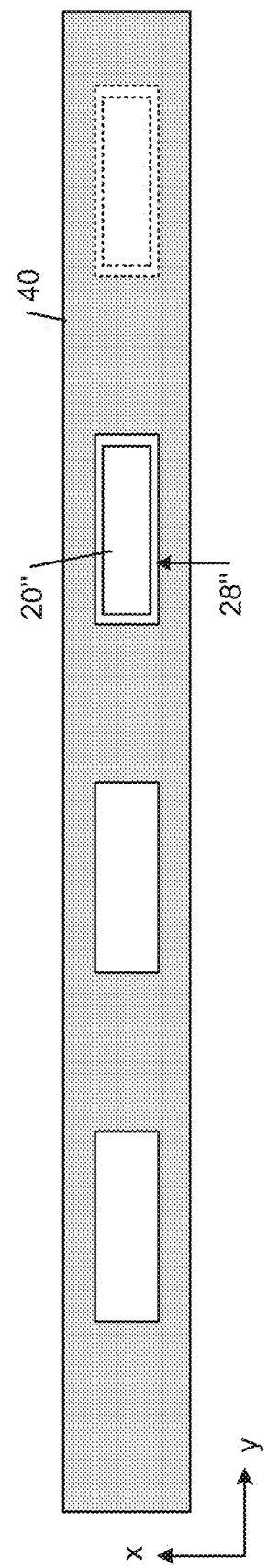
FIG. 2A
FIG. 2B

ROLL-TO-ROLL ADDITIVE MANUFACTURING METHOD AND DEVICE

The present disclosure claims priority to U.S. Provisional Patent Application No. 62/900,333, filed on Sep. 13, 2019, which is incorporated herein in its entirety.

FIELD OF THE DISCLOSURE

The disclosure generally relates to manufacturing processes for electronic devices.

BACKGROUND

Additive manufacturing typically involves forming a three-dimensional object by adding layers of material (e.g., plastic and metal). Designing such three-dimensional objects is a time-consuming process, despite the availability of powerful computer aided design (CAD) tools. For this reason, conventional additive manufacturing techniques, such as stereo lithography, selective laser sintering, and fused deposition modeling, typically are reserved for use in manufacturing complex, low volume, and high cost parts.

SUMMARY

In an embodiment, a process of manufacturing a flexible laminate electronic device is disclosed. The process includes placing electronic components over a flexible substrate layer that includes electrical connections between the electronic components. A first flexible additive layer that includes apertures is positioned to align each of the electronic components in a respective aperture. A subsequent flexible additive layer is arranged over the first flexible additive layer and the apertures are aligned around respective portions of the electronic components protruding above the first flexible additive layer. A flexible cover layer is placed over the subsequent flexible additive layer.

In another embodiment, a flexible laminate electronic device includes a flexible substrate that includes electrical connections between electronic components attached to the flexible substrate. A first flexible additive layer includes apertures, wherein at least one of the one or more electronic components is aligned in one of the apertures. A subsequent flexible additive layer is disposed over the first flexible additive layer and aligned around respective portions of the electronic components protruding above the first flexible additive layer. A flexible cover layer is placed over the subsequent flexible additive layer.

Additional descriptions of features and details of the present invention are described in the following specification and drawings.

BRIEF DESCRIPTION OF THE DRAWINGS

FIG. 2A illustrates an embodiment of a first flexible additive layer with two apertures for each flexible electronic device segment.

FIG. 2B illustrates an embodiment of a subsequent flexible additive layer with one aperture for each flexible electronic device segment.

DETAILED DESCRIPTION

Figure 1:
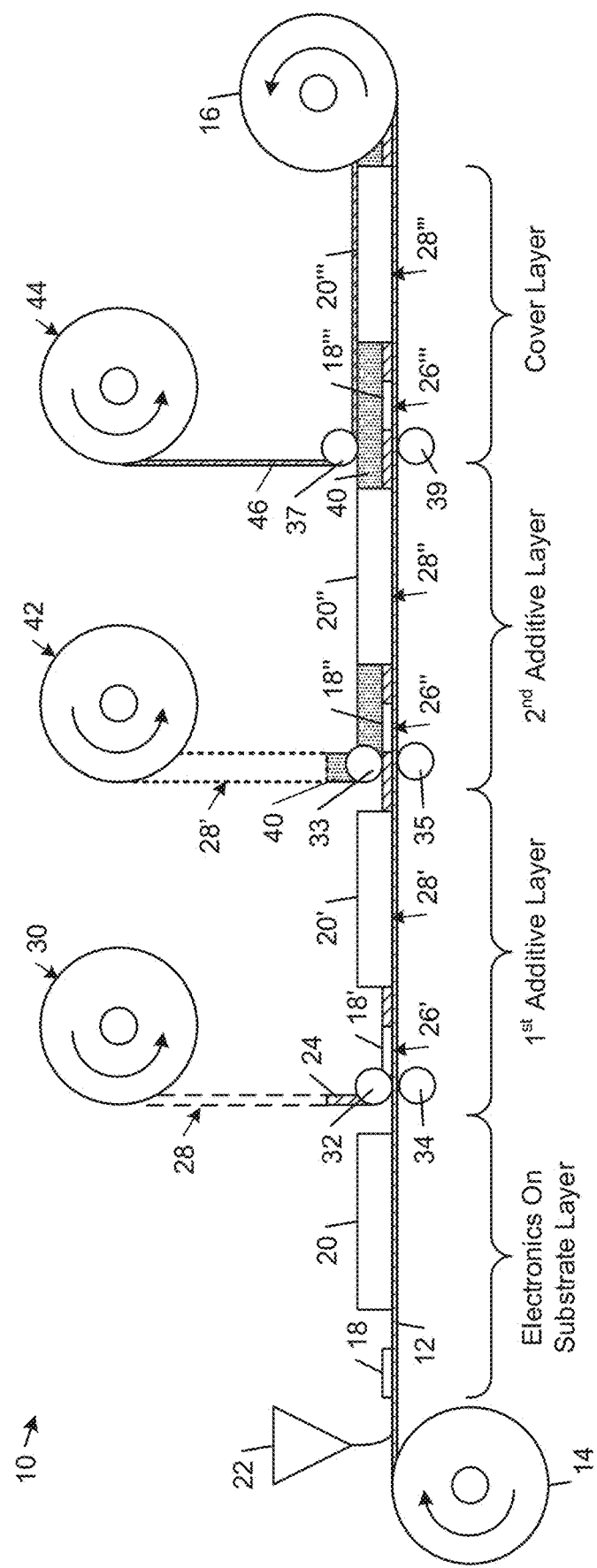
FIG. 1 illustrates an embodiment of an apparatus for implementing a roll-to-roll process of manufacturing a series of contiguous flexible electronic devices.

In the following description, like reference numbers are used to identify like elements.

Furthermore, the drawings are intended to illustrate major features of exemplary embodiments in a diagrammatic manner. The drawings are not intended to depict every feature of actual embodiments nor relative dimensions of the depicted elements. The drawings are not drawn to scale.

The present invention is not limited in any way to the illustrated embodiments. Instead, the illustrated embodiments described below are merely examples of the invention. Therefore, the structural and functional details disclosed herein are not to be construed as limiting the claims. The disclosure merely provides bases for the claims and representative examples that enable one skilled in the art to make and use the claimed inventions. Furthermore, the terms and phrases used herein are intended to provide a comprehensible description of the invention without being limiting.

As used herein, the term "or" refers an inclusive "or" rather than an exclusive "or." In addition, the articles "a" and "an" as used in the specification and claims mean "one or more" unless specified otherwise or clear from the context to refer the singular form.

The terms "module," "manager," and "unit" refer to hardware, software, or firmware, or a combination thereof.

Exemplary Embodiments

Disclosed herein is a low-cost, multi-function flexible platform (also referred to herein as a "tape platform") with a form factor that integrates the components useful for implementing a combination of different functions and also is able to perform a useful ancillary function that otherwise would have to be performed with the attendant need for additional materials, labor, and expense. In an aspect, the flexible platform is implemented as a collection of flexible products that integrate wireless communications and sensing components within a flexible structure in a way that not only provides a cost-effective platform for interconnecting, optimizing, and protecting the components of the system but also maintains the flexibility needed to function as a flexible product that can be deployed seamlessly into various applications and workflows. The various applications and workflows may include person and object tracking applications, asset management workflows such as manufacturing, storage, shipping, delivery, and other tasks associated with moving products and other physical objects, including logistics, sensing, tracking, locationing, warehousing, parking, safety, construction, event detection, road management and infrastructure, security, and healthcare. The multi-function flexible platform may have an adhesive tape platform and have a dual function of an adhesive tape that can adhere to an object or seal an object, in addition to being a wireless communications and sensing device. In some examples, the adhesive tape platforms (also referred to herein as "tape nodes") are used in various aspects of asset tracking and management, including sealing assets, transporting assets, tracking assets, monitoring the conditions of assets, inventorying assets, and verifying security of assets. In some examples, a parcel sealed with the adhesive tape platform typically is transported from one location to another by truck, train, ship, or aircraft, or within premises, e.g., warehouses, by forklift, trolleys etc.

In some embodiments, the tape platform includes a plurality of segments that can be separated from the adhesive product (e.g., by cutting, tearing, peeling, or the like) and adhesively attached to a variety of different surfaces to inconspicuously implement any of a wide variety of different wireless communications based network communications and transducing (e.g., sensing, actuating, etc.) applications. Examples of such applications include: event detection applications, monitoring applications, security applications, notification applications, and tracking applications, including inventory tracking, asset tracking, person tracking, animal (e.g., pet) tracking, manufactured parts tracking, and vehicle tracking. In example embodiments, each segment of an adhesive tape platform is equipped with an energy source, wireless communication functionality, transducing functionality, and processing functionality that enable the segment to perform one or more transducing functions and report the results to a remote server or other computer system directly or through a network of tapes. The components of the tape platform are encapsulated within a flexible structure that protects the components from damage while maintaining the flexibility needed to function as an adhesive tape (e.g., duct tape or a label) for use in various applications and workflows. In addition to single function applications, some embodiments also include multiple transducers (e.g., sensing and/or actuating transducers) that extend the utility of the platform by, for example, providing supplemental information and functionality relating characteristics of the state and or environment of, for example, an article, object, vehicle, or person, over time.

Systems and processes for fabricating flexible multifunction adhesive tape platforms in efficient and low-cost ways also are described. In addition to using roll-to-roll and/or sheet-to-sheet manufacturing techniques, the fabrication systems and processes are configured to optimize the placement and integration of components within the flexible adhesive structure to achieve high flexibility and durability. These fabrication systems and processes are able to create useful and reliable tape platforms that can provide local sensing, wireless transmitting, locationing functionalities, other functionalities, or some combination thereof. Such functionality together with the low cost of production is advantageous for the ubiquitous deployment of adhesive tape platform segments for various applications and thereby alleviate at least some of the problems arising from gaps in conventional infrastructure coverage that prevent continuous monitoring, event detection, security, tracking, and other logistics applications across heterogeneous environments.

In particular embodiments described herein, examples of a low-cost, roll-to-roll additive manufacturing method of fabricating flexible electronic devices are provided. Roll-to-roll additive layer-based manufacturing methods and devices formed by these methods are described. The manufacturing methods include use of low-cost electronic components embedded within low-cost, flexible, multi-layered, encapsulating structures that protect the embedded electronic components and associated wiring components. In general, the flexible electronic devices may incorporate a wide variety of electronic components, such as microcontrollers, wireless communications systems, antennas, sensors, other components, or some combination thereof. In addition to the various functionalities of the embedded electronic components, embodiments of the flexible electronic devices also can function as adhesive tapes, labels, stickers, or any other type of flexible tape and/or flexible adhesive tape product.

FIG. 1 shows a diagrammatic side view of an embodiment of an apparatus 10 for implementing a roll-to-roll process for manufacturing a series of contiguous segments corresponding to respective flexible electronic devices. In this process, a flexible substrate layer 12 is dispensed from a roll 14, processed through a number of additive layer stages and a cover 46 application stage, and the composite structure is taken-up by a roll 16.

In the first stage of the illustrated automated manufacturing embodiment, the manufacturing apparatus 10 includes an adhesive dispenser 22 that deposits a layer of adhesive on the top surface of the substrate layer 12 to fix electronic components 18, 20 in place on the substrate layer 12. In some examples, the substrate layer 12 carries a pre-applied adhesive on the top surface of the substrate layer 12. In some embodiments, the pre-applied adhesive is uniformly distributed across the top surface of the substrate layer 12. In other embodiments, the adhesive is located only in regions of the top surface of the substrate layer 12 corresponding to the specified locations of the electronic components. In the above-mentioned embodiments, the adhesive may be a pressure sensitive adhesive or a liquid adhesive.

In some examples, the electronic components are placed on the substrate layer 12 by automated equipment. For example, in some embodiments, a precision pick-and-place robotic arm and camera is used to pick up electronic components 18, 20 and precisely place the electronic components 18, 20 at specified locations on the substrate layer 12. The electronic components 18, 20 typically are interconnected by one or more electrical connections. In some embodiments, the electrical connections are direct wire connections between the electronic components 18, 20. In other embodiments, the substrate layer 12 includes one or more wiring layers that electrically interconnect the electronic components 18, 20 either on the top surface of the flexible substrate layer 12 or embedded in the flexible substrate layer 12. In some embodiments, the electronic components 18, 20 are soldered to portions of one or more wiring layers on the top surface of the flexible substrate layer 12 or embedded in the flexible substrate layer to electrically connect the electronic components 18, 20 to the one or more wiring layers. In other embodiments, the electronic components 18, 20 are electrically connected to one or more wiring layers by other techniques. For example, the electronic components 18, 20 may be electrically connected to one or more wiring layers by surface mounting techniques, pick-and-place techniques, die bonding techniques, reflow soldering, other techniques, or some combination thereof, according to some embodiments.

A wide variety of electronic components may be incorporated into the segments of flexible electronic devices. Example electronic components include batteries, microcontrollers, wireless communications systems, antennas, and sensor circuits. The microcontrollers typically include one or more CPUs (e.g., processor cores), a memory, and programmable input and output peripherals. The wireless communications systems typically are implemented by one or more network interface controllers that include one or more wireless network communications interfaces. For example, the wireless communications systems may include a cellular communication system (e.g., GSM/GPRS), a Wi-Fi communication system, an RF communication system (e.g., LoRa), a Bluetooth communication system (e.g., a Bluetooth Low Energy system), a Z-wave communication system, a ZigBee communication system, other communication systems, or some combination thereof.

In the second stage of the illustrated manufacturing embodiment, a first flexible additive layer 24 is unrolled from a roll 30 and positioned over the substrate layer 12 with the electronic components 18', 20' spatially aligned with respective apertures 26', 28' in the first flexible additive layer 24. FIG. 2A shows a top view of a segment of the first additive layer 24 including the apertures 26', 28'. The apertures 26', 28' are aligned spatially with the corresponding electronic components 18', 20'. As shown in FIG. 2A, the x-y dimensions of the apertures 26', 28' in the first flexible additive layer 24 are larger than the corresponding x-y dimensions of the electronic components 18', 20' so that the apertures 26', 28' can accommodate the electronic components 18', 20' and thereby create a substantially uniform thickness along the length of the flexible adhesive product. As shown in FIG. 2A, in some examples, the differences in the x-y dimensions of the apertures 26', 28' and the corresponding x-y dimensions of the electronic components are 0.1 mm or less.

In some embodiments, referring to FIG. 1, as the first flexible additive layer 24 is dispensed from a supply roll 30, a pair of laminating rollers 32, 34 apply a compressive force between the first flexible additive layer 24 and the underlying substrate layer 12 to assist in aligning the apertures 26', 28' in the first flexible additive layer 24 with the corresponding features of the electronic components 18', 20' adhered to the surface of the substrate layer 12 by urging the apertures 26', 28' formed in first flexible additive layer 24 into alignment over the protruding portions of the electronic components 18', 20'. In some examples, the bottom surface of the first flexible additive layer 24 includes an adhesive layer, which may be, for example, a pressure sensitive adhesive, a non-pressure sensitive adhesive, other suitable adhesive, or some combination thereof.

In a third stage of the illustrated manufacturing embodiment, a second flexible additive layer 40 is unrolled from a roll 42 and arranged over the first flexible additive layer 24 and the electronic components 18", 20" with the electronic component 20" spatially aligned in the aperture 28" formed in the second flexible additive layer 40. FIG. 2B shows a top view of a segment of the second flexible additive layer 40 including the aperture 28". As shown in FIG. 2B, the x-y dimensions of the aperture 28" in the second flexible additive layer 40 is larger than the corresponding x-y dimensions of the electronic component 20" so that the aperture 28" can accommodate the size of the electronic component 20" and thereby create a substantially uniform thickness along the length of the flexible product. In some embodiments, the differences in the x-y dimensions of the aperture 28" and the corresponding x-y dimensions of the electronic component 20" are 0.1 mm or less.

In some embodiments, referring to FIG. 1, as the second flexible additive layer 40 is dispensed from a supply roll 42, a pair of laminating rollers 33, 35 apply a compressive force between the second flexible additive layer 40 and the underlying first flexible additive layer 24 to assist in aligning the apertures 26" in the second flexible additive layer 40 with the corresponding features of the electronic component 20" adhered to the surface of the substrate layer 12 by urging the aperture 28" formed in the second flexible additive layer 40 into alignment over the protruding portions of the electronic component 20". In some examples, the bottom surface of the second flexible additive layer 40 includes an adhesive layer, which may be, for example, a pressure sensitive adhesive, a non-pressure sensitive adhesive, other suitable adhesive, or some combination thereof.

As shown in FIG. 0.1, the first flexible additive layer 24 may have a thickness that corresponds to a thickness of the electronic component 18'. Thus, when the first flexible additive layer 24 is dispensed with the apertures 26', 28' aligned with the corresponding electronic components 18', 20', a top surface of the first flexible additive layer 24 may be flush with a top surface of the electronic component 18'. Similarly, second flexible additive layer 40 may have a thickness that corresponds to a thickness of the electronic component 20". In some embodiments, the second flexible additive layer 40 may have a thickness corresponding to the difference between the thickness of the electronic component 20" and the first flexible additive layer 24. Thus, when the second flexible additive layer 40 is dispensed with the aperture 28" aligned with the corresponding electronic component 20", a top surface of the second flexible additive layer 40 may be flush with a top surface of the electronic component 20".

In a fourth stage of the illustrated manufacturing embodiment, a flexible cover layer 46 is unrolled from a supply roll 44 of a cover material and arranged over the electronic component 20'" and the second flexible additive layer 40.

In some embodiments, as the flexible cover layer 46 is dispensed from a supply roll 44, a pair of laminating rollers 37, 39 apply a compressive force between the flexible cover layer 46 and the underlying second flexible additive layer 40. In some examples, the bottom surface of the flexible cover layer 46 includes an adhesive layer, which may be, for example, a pressure sensitive adhesive, a non-pressure sensitive adhesive, other suitable adhesive, or some combination thereof.

In some examples, the flexible cover layer 46 and the flexible substrate 12 may have the same or different compositions depending on the intended application. In some examples, one or both of the flexible cover 46 and the flexible substrate 12 include flexible film layers and/or paper substrates, where the film layers may have reflective surfaces or reflective surface coatings. Example compositions for the flexible film layers include polymer films, such as polyester, polyimide, polyethylene terephthalate (PET), other plastics, or some combination thereof. Optional adhesive layers may be applied on the bottom surface of the flexible cover layer 46 and on the top and bottom surfaces of the flexible substrate 12. In some embodiments, these adhesive layers typically include a pressure-sensitive adhesive (e.g., a silicon-based adhesive). In some examples, the adhesive layers are applied to the flexible cover 46 and the flexible substrate 12 during manufacture (e.g., during a roll-to-roll or sheet-to-sheet fabrication process). In other examples, the flexible cover 46 may be implemented by a prefabricated single-sided pressure-sensitive adhesive tape and the flexible substrate 12 may be implemented by a prefabricated double-sided pressure-sensitive adhesive tape; both kinds of tape may be readily incorporated into a roll-to-roll or sheet-to-sheet fabrication process. In some embodiments, a flexible polymer layer is included between the flexible substrate 12 and the flexible cover layer 46. In further embodiments, the flexible polymer layer is included beneath the flexible cover layer 46 and assists in adhering the flexible cover layer 46 to the second flexible additive layer 40 and the electronic component 20'''. In some embodiments, the flexible polymer layer planarizes the section of the flexible electronics device including the electronic component 20''' and the second flexible additive layer 40. The flexible polymer layer may be composed of a flexible epoxy (e.g., silicone), according to some embodiments.

In some embodiments, an optional adhesive layer is on a top surface of the flexible cover layer 46. In further embodiments, both an adhesive layer is on the bottom surface of the flexible substrate 12 and another adhesive layer is on the top surface of the flexible cover layer 46, resulting in a double-sided adhesive tape platform, where the top side of the flexible electronics device and the bottom side of the flexible electronics device can be adhered to a surface.

In other embodiments, the flexible electronics device fabricated on the flexible substrate 12 according to the automated manufacturing process illustrated in FIG. 1 are cut into segments after completing the automated manufacturing process instead of being taken up by the roll 16, after the flexible cover layer is added. The flexible electronics device may be cut in portions where no electronic components 18, 20 or wiring layers are present, resulting in a plurality of flexible electronics device segments where each segment is an individual device.

In some embodiments, the apertures 26', 28', 26", 28", 26''', 28''' are formed by stamping out a portion of the respective flexible additive layer. In other embodiments, the apertures 26', 28', 26", 28", 26''', 28''' are formed by cutting out portions of the respective flexible additive layer by other methods.

Figure 3:
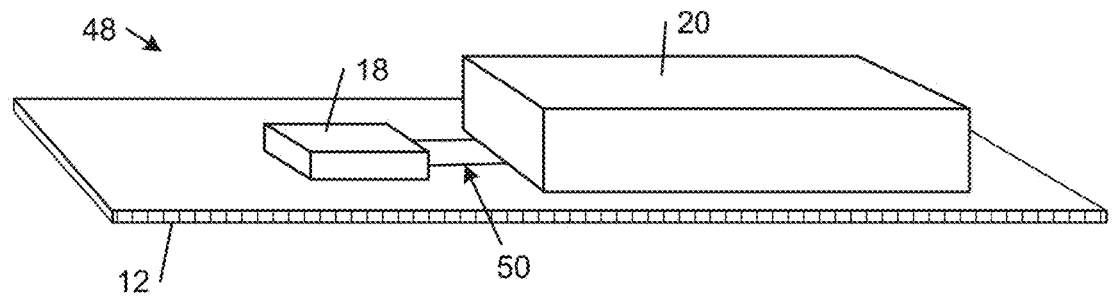
FIG. 3 is perspective view of an embodiment of two electronic components mounted to a flexible substrate segment.

FIG. 3 shows a perspective view of a flexible electronic device 48 in the first stage of process of fabrication in accordance with the manufacturing process described above, with respect to FIG. 1, according to some embodiments. In the illustrated embodiment, the electronic device 48 includes two electronic components 18, 20 mounted on a surface of a segment of a flexible substrate 12 in the first stage of the automated manufacturing process shown in FIG. 1. The electronic components 18, 20 are adhesively mounted to a surface of the flexible substrate segment 12. In the illustrated embodiment, the electronic components 18, 20 are interconnected by a wiring layer 50 on the surface of the flexible substrate segment 12. As explained above, in other embodiments, the wiring layer 50 may be embedded within the flexible substrate segment 12.

Figure 4A:
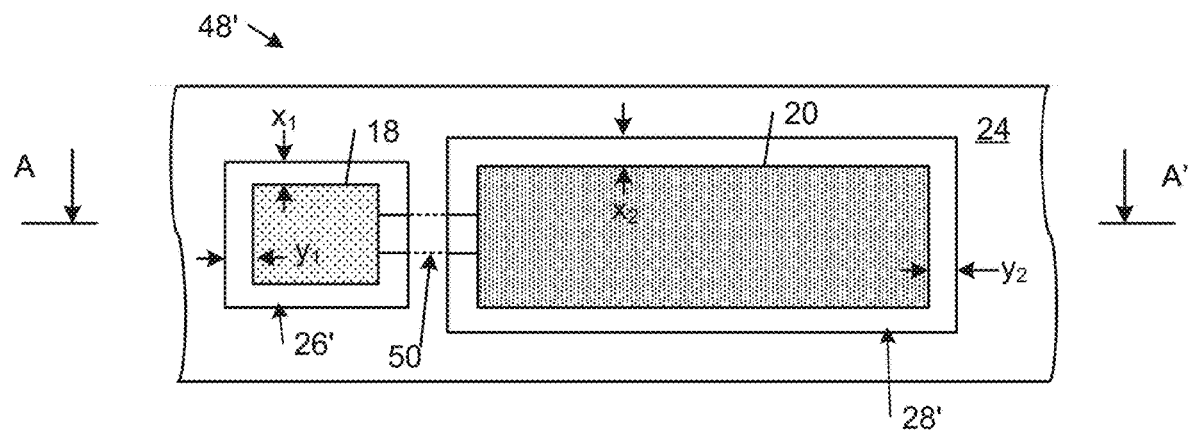
FIG. 4A is a top view of an embodiment of the flexible substrate segment shown in FIG. 3 with a first overlaying flexible additive layer that has two apertures encircling respective electronic component
Figure 4B:
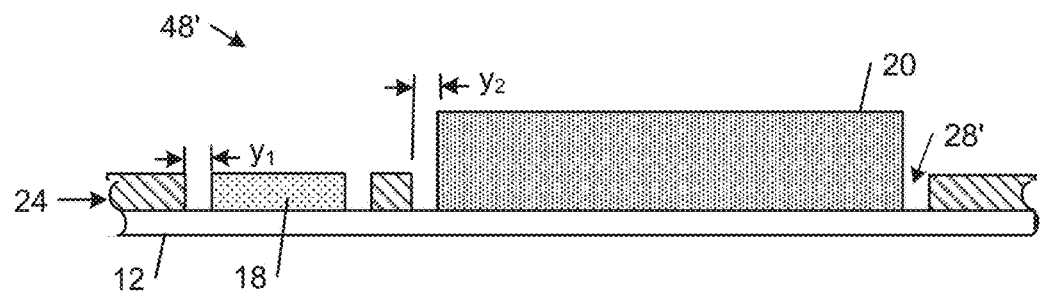
FIG. 4B is a cross-sectional side view from A to A' of an embodiment of the flexible substrate segment shown in FIG. 3 with a first overlaying flexible additive layer that has two apertures encircling respective electronic components.

FIG. 4A is a top view of an embodiment of the flexible electronic device 48', after the second stage of the automated manufacturing process shown in FIG. 1. The flexible electronic device 48' is the same as the flexible electronic device 48, but with the addition of the first flexible additive layer 24 added in the second stage of the automated manufacturing process. FIG. 4B is a cross-sectional side view from A to A' of the flexible electronic device 48' shown in FIG. 4A. FIGS. 4A and 4B respectively show top and cross-sectional side views of the flexible electronic device 48' after the first additive layer 24 is unrolled from a roll 30 and positioned over the substrate layer 12. In this process, the apertures 26', 28' in the first additive layer 24 are aligned with the respective components 18, 20. As shown in FIGS. 4A and 4B, the planar cross-sections of the components 18, 20 are smaller than the respective apertures 26', 28'. As a result, there are gaps between the electronic components 18, 20 and the sidewalls of the apertures 26', 28', as denoted by the parameters $x_1$, $y_1$, $x_2$, $y_2$ in FIGS. 4A and 4B. As explained above, the gaps between the components 18, 20 and the sidewalls of the apertures 26', 28' assist in sliding the first additive layer 24 over the electronic components 18, 20 to create a laminate structure between the substrate and the first additive layer 24. In some embodiments, both the parameters $x_1$ and $y_1$ are less than or equal to 0.1 mm (i.e. the gap between a respective sidewalls of the aperture 26' and a respective edge of the electronic component 18 is less than 0.1 mm). In some embodiments, both the parameters $x_2$ and $y_2$ are less than or equal to 0.1 mm (i.e. the gap between a respective sidewall of the aperture 28' and a respective edge of the electronic component 20 is less than 0.1 mm).

In some embodiments, as shown in FIG. 4B, the thickness of the first flexible additive layer 24 corresponds to a thickness of the electronic component 18. This results in a top surface of the flexible additive layer 24 being flush with a top surface of the electronic component 18. This may be done so that a majority of the flexible electronic device 48' has a relatively same thickness. For example, as shown in FIG. 4B, portions of the flexible electronic device 48' that overlap with the first flexible additive layer 24 has a same thickness of portions of the flexible electronic device 48' that overlap with the electronic component 18.

Figure 5:
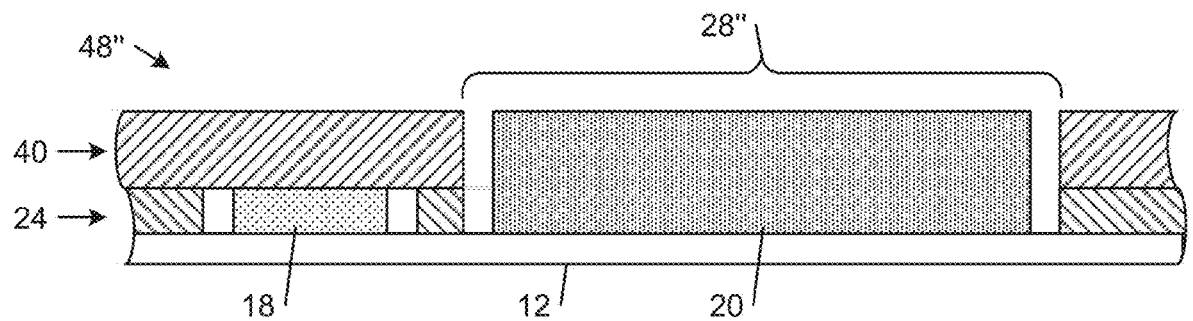
FIG. 5 is a cross-sectional side view corresponding to the cross-sectional side view shown in FIG. 4B of the flexible substrate segment with an embodiment of a second overlaying flexible additive layer that has one aperture encircling a respective electronic component.

FIG. 5 shows a cross-sectional side view of the flexible electronic device 48" after the third stage of the automated manufacturing process shown in FIG. 1 in which the second flexible additive layer 40 is unrolled from a roll 42 and positioned over the first additive layer 24. The flexible electronic device 48 is the same as the flexible electronic device 48' shown in FIG. 4B but with the addition of the second flexible additive layer 40. In this process, the aperture 28" in the second additive layer 40 is aligned with the component 20. As shown in FIG. 5, the planar cross-section of the electronic component 20 is smaller than the respective aperture 28". As a result, there are gaps between the electronic component 20 and the sidewalls of the aperture 28". As explained above, the gaps between the component 20 and the sidewalls of the aperture 28" assist in sliding the second additive layer 40 over the electronic component 20 to create a laminate structure between the first additive layer 24 and the second additive layer 40. In some embodiments, a gap between an edge of the component 20 and a respective sidewall of the aperture 28" is less than or equal to 0.1 mm.

In some embodiments, as shown in FIG. 5, the thickness of the second flexible additive layer 40 corresponds to a thickness of the electronic component 20 and a thickness of the first flexible additive layer 24. In one example, as illustrated in FIG. 5, the sum of the thicknesses of the first flexible additive layer 24 and the second flexible additive layer 40 correspond to a thickness of the electronic component 20. This results in a top surface of the second flexible additive layer 40 being flush with a top surface of the electronic component 20. This may be done so that a majority of the flexible electronic device 48" has a relatively same thickness. For example, as shown in FIG. 5, portions of the flexible electronic device 48" that overlap with the second flexible additive layer 40 has a same thickness of portions of the flexible electronic device 48" that overlap with the electronic component 20.

Figure 6:
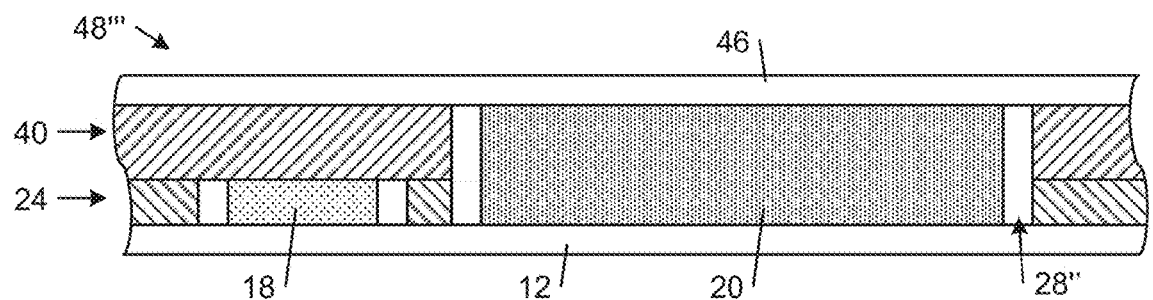
FIG. 6 is a cross-sectional side view corresponding to the cross-sectional side view shown in FIG. 5 of the flexible substrate segment with an embodiment of a top overlaying flexible cover layer.

FIG. 6 shows a cross-sectional side view of the flexible electronic device 48''' after the fourth stage of the automated manufacturing process shown in FIG. 1 in which the flexible cover layer 46 is unrolled from a roll 44 and positioned over the second additive layer 40 to complete the flexible electronic devices. The flexible electronic device 48''' is the same as the flexible electronic device 48" shown in FIG. 5 but with the addition of the flexible cover layer 46. In the illustrated embodiment, the resulting continuous flexible laminate electronic device segments are completed sequentially and taken up on the roll 16 (see FIG. 1).

The embodiments described above are examples of a low-cost, roll-to-roll, additive and layer-based method of fabricating an elongated flexible structure having segments with embedded electronic devices. In particular, the roll-to-roll additive layer-based manufacturing method involves layering a series of material layers (typically plastic) to build up a thickness that matches height profiles of the embedded electronic components to produce an elongated flexible tape-like laminate structure of substantially uniform thickness with segments containing embedded electronics.

One aspect of achieving a low-cost flexible device is to minimize the number of layers needed to construct a planar tape-like laminate structure. In some low complexity embodiments (e.g., embodiments with a relatively small set of feature heights), it may be possible to empirically derive a set of feature heights that corresponds to a low-cost solution. For example, with a small set of feature heights, one can empirically determine a set of height differences that achieves the fewest number of additive layers that results in a substantially uniform tape-like laminate structure. For more complex embodiments, an optimization algorithm typically is needed to determine a low-cost solution.

Figure 7:
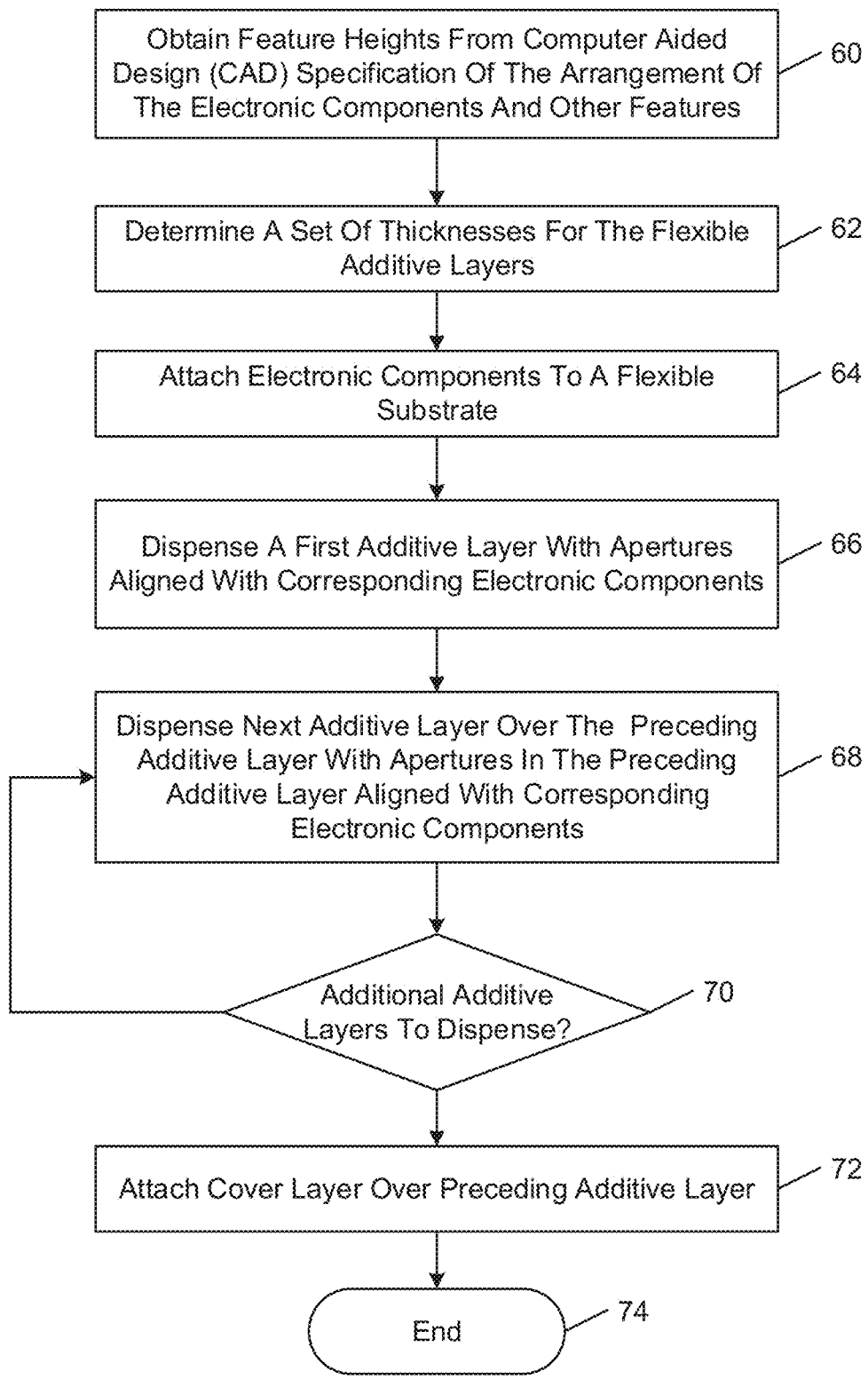
FIG. 7 is a flow chart illustrating steps of a method of fabricating a flexible electronic device, according to some embodiments.

FIG. 7 shows an embodiment of a computer-implemented method of fabricating a specification of a flexible electronic device. In accordance with this method, feature heights are obtained from a received computer aided design (CAD) specification of the arrangement of the electronic components and other features to be incorporated in the flexible tape-like laminate structure (FIG. 7, block 60). In some embodiments, the feature heights are received alongside the CAD specification. In other embodiments, the feature heights are determined based on the received CAD specification.

A number of flexible additive layers and a respective set of thicknesses for the flexible additive layers is determined (FIG. 7, block 62) based on the obtained feature heights. In some embodiments, the flexible additive layer thicknesses are determined by calculating height differences between each pair of feature heights obtained from the CAD specification. A preliminary set of the flexible additive layer thickness includes all of the feature heights and all of the feature height differences. An optimization program is run on the preliminary set of the flexible additive layer thicknesses, which is a nonlinear combinatorial problem. In some embodiments, the optimization program runs an exhaustive or brute-force search algorithm for the smallest set of the flexible additive layer thicknesses subject to a specified tolerance level (e.g., 0.1 mm). In other embodiments, an evolutionary algorithm is used to solve the nonlinear combinatorial optimization problem. For example, a genetic evolutionary algorithm may be used for layer stacking sequence optimization. A differential evolution algorithm also may be used to determine an optimized stack-up sequence of laminate composite structures, according to some embodiments.

After the set of thicknesses for the flexible additive layers has been determined, the electronic components are attached to a flexible substrate (FIG. 7, block 64). A first additive layer with apertures is dispensed with the apertures aligned with respective electronic components attached to the flexible substrate (FIG. 7, block 66). A next additive layer is dispensed over the preceding additive layer with the apertures in the next additive layer aligned with respective electronic components attached to the flexible substrate that protrude past the preceding additive layer (FIG. 7, block 68). If there are addition additive layers to dispense (FIG. 7, block 70), the process returns to block 68 to dispense a next additive layer over the preceding additive layer (FIG. 7, block 68). Otherwise, the process advances to the step of attaching a cover layer over the preceding additive layer (FIG. 7, block 72). After the cover layer is attached over the preceding additive layer, the process ends (FIG. 7, block 74). In some embodiments, the flexible electronic device is gathered into a roll after the cover layer is attached (FIG. 7, block 74). In other embodiments, the flexible electronic device is cut into segments, resulting in a plurality of flexible electronic device segments.

Exemplary Computer Apparatus

Figure 8:
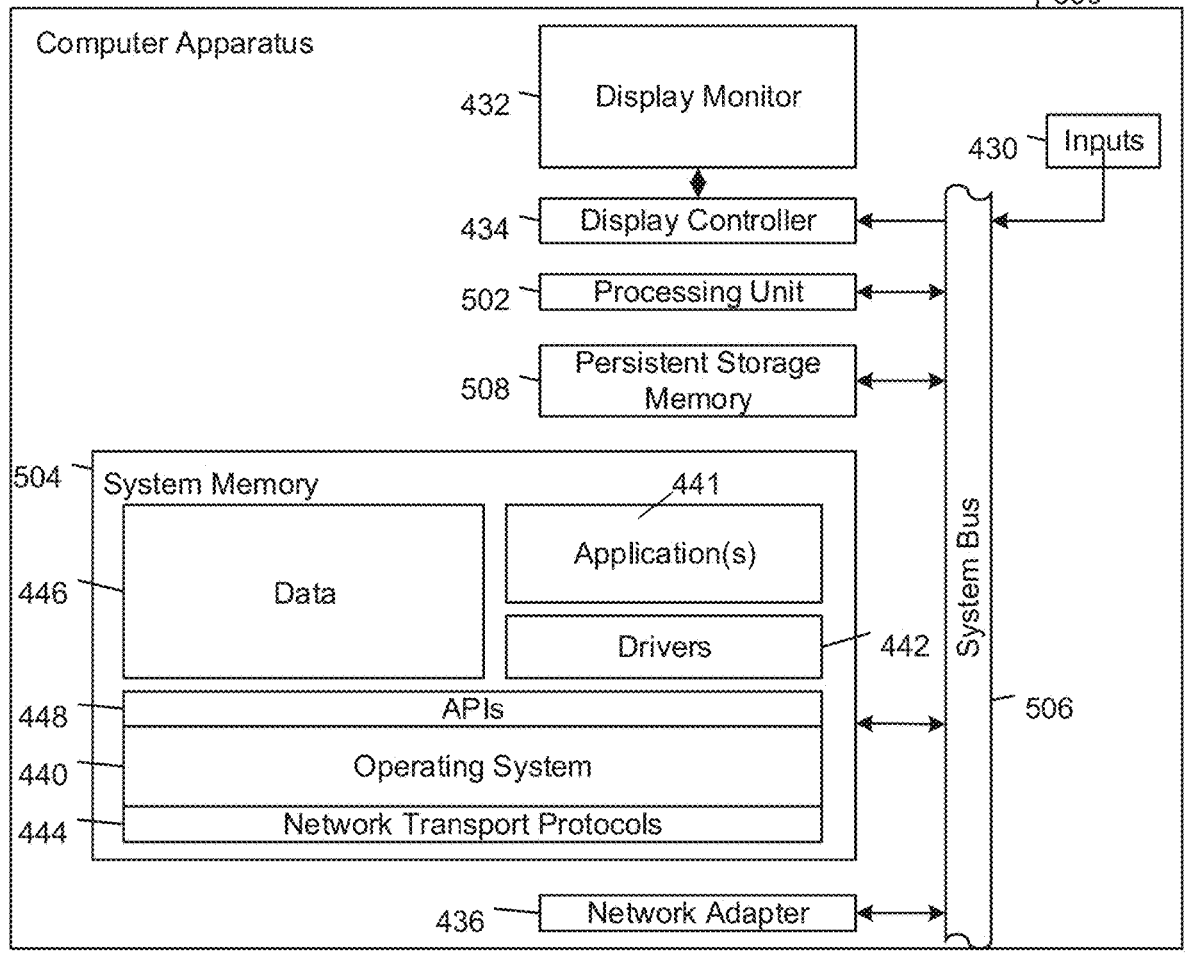
FIG. 8 is a block diagram of a computer apparatus, according to some embodiments.

FIG. 8 shows an example embodiment of a computer apparatus 500 that is configured to implement one or more of the systems described in this specification. In some embodiments, an embodiment of the computer apparatus 500 executes steps of the automatic manufacturing process described above, with respect to FIGS. 1 and 7. The computer apparatus 500 includes a processing unit 502, a system memory 504, and a system bus 506 that couples the processing unit 502 to the various components of the computer apparatus 500. The processing unit 502 may include one or more data processors, each of which may be in the form of any one of various commercially available computer processors. The system memory 504 includes one or more computer-readable media that typically are associated with a software application addressing space that defines the addresses that are available to software applications. The system memory 504 may include a read only memory (ROM) that stores a basic input/output system (BIOS) that contains start-up routines for the computer apparatus 500, and a random access memory (RAM). The system bus 506 may be a memory bus, a peripheral bus or a local bus, and may be compatible with any of a variety of bus protocols, including PCI, VESA, Microchannel, ISA, and EISA. The computer apparatus 500 also includes a persistent storage memory 508 (e.g., a hard drive, a floppy drive, a CD ROM drive, magnetic tape drives, flash memory devices, and digital video disks) that is connected to the system bus 506 and contains one or more computer-readable media disks that provide non-volatile or persistent storage for data, data structures and computer-executable instructions.

A user may interact (e.g., input commands or data) with the computer apparatus 500 using one or more input devices 430 (e.g. one or more keyboards, computer mice, microphones, cameras, joysticks, physical motion sensors, and touch pads). Information may be presented through a graphical user interface (GUI) that is presented to the user on a display monitor 432, which is controlled by a display controller 434. The computer apparatus 500 also may include other input/output hardware (e.g., peripheral output devices, such as speakers and a printer). The computer apparatus 500 connects to other network nodes through a network adapter 436 (also referred to as a "network interface card" or NIC).

A number of program modules may be stored in the system memory 504, including application programming interfaces 448 (APIs), an operating system (OS) 440 (e.g., the Windows® operating system available from Microsoft Corporation of Redmond, Wash. U.S.A.), software applications 441 including one or more software applications programming the computer apparatus 500 to perform one or more of the steps, tasks, operations, or processes of the hierarchical classification systems described herein, drivers 442 (e.g., a GUI driver), network transport protocols 444, and data 446 (e.g., input data, output data, program data, a registry, and configuration settings).

Examples of the subject matter described herein, including the disclosed systems, process, processes, functional operations, and logic flows, can be implemented in data processing apparatus (e.g., computer hardware and digital electronic circuitry) operable to perform functions by operating on input and generating output. Examples of the subject matter described herein also can be tangibly embodied in software or firmware, as one or more sets of computer instructions encoded on one or more tangible non-transitory carrier media (e.g., a machine readable storage device, substrate, or sequential access memory device) for execution by data processing apparatus.

Exemplary Adhesive Tape Platform

Figure 9A:
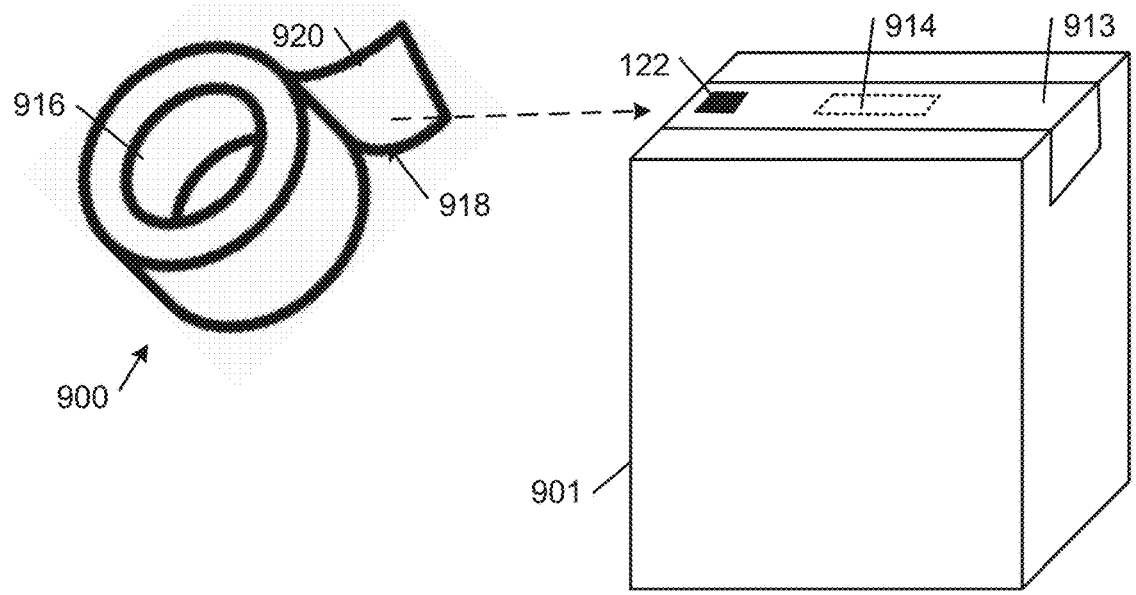
FIG. 9A is a diagrammatic view of a package that has been sealed for shipment using a segment of an example tracking adhesive product dispensed from a roll, according to some embodiments.
Figure 9B:
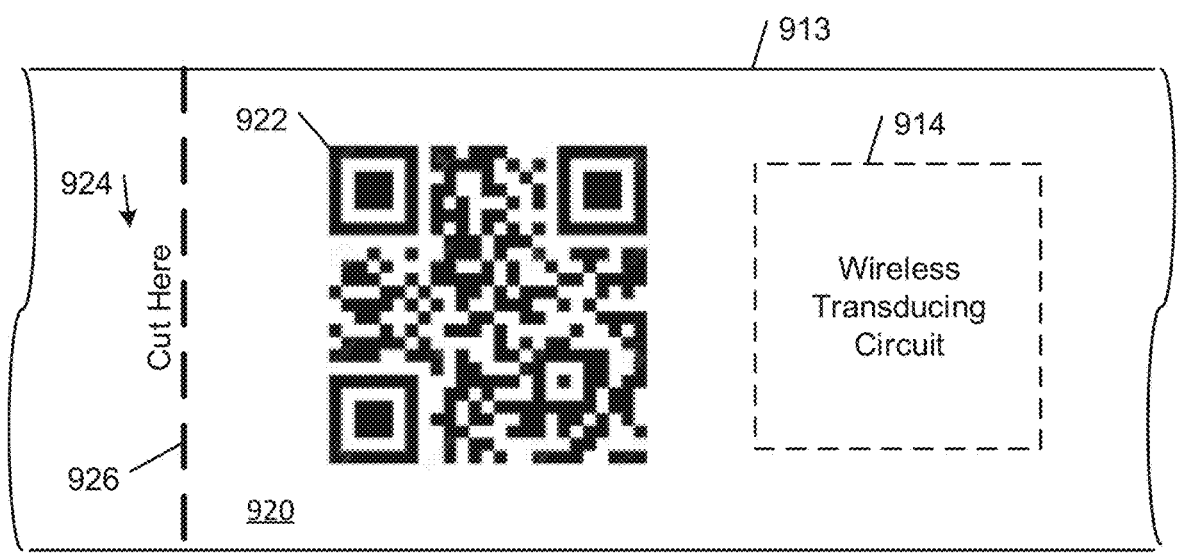
FIG. 9B is a diagrammatic top view of a portion of the segment of the example tracking adhesive product shown in FIG. 9A, according to some embodiments.

FIGS. 9A and 9B show an example adhesive tape platform 900 that is fabricated according to the automated manufacturing processes described above, with respect to FIGS. 1-7. The example of the adhesive tape platform 900 is a wireless communication and sensing device that also has the functionality and form factor of an adhesive tape which can seal items and adhere to items. As illustrated in FIG. 9A, the adhesive tape platform is a flexible electronic device which has been gathered into a roll 916 according to the process shown in FIG. 1.

FIG. 9A shows an example asset 901 that is sealed for shipment using an example adhesive tape platform 900 that includes embedded components of a wireless transducing circuit 914 (collectively referred to herein as a "tape node"). In this example, a segment 913 of the adhesive tape platform 900 is dispensed from a roll 916 and affixed to the asset 901. The adhesive tape platform 900 includes an adhesive side 918 and a non-adhesive side 920. The adhesive tape platform 900 can be dispensed from the roll 916 in the same way as any conventional packing tape, shipping tape, or duct tape. For example, the adhesive tape platform 900 may be dispensed from the roll 916 by hand, laid across the seam where the two top flaps of the asset 901 meet, and cut to a suitable length either by hand or using a cutting instrument (e.g., scissors or an automated or manual tape dispenser). Examples of such tapes include tapes having non-adhesive sides 920 that carry one or more coatings or layers (e.g., colored, light reflective, light absorbing, and/or light emitting coatings or layers).

Referring to FIG. 9B, in some examples, the non-adhesive side 920 of the segment 913 of the adhesive tape platform 900 includes writing or other markings that convey instructions, warnings, or other information to a person or machine (e.g., a bar code reader), or may simply be decorative and/or entertaining. For example, different types of adhesive tape platforms may be marked with distinctive colorations to distinguish one type of adhesive tape platform from another. In the illustrated example, the segment 913 of the adhesive tape platform 900 includes a two-dimensional bar code (e.g., a QR Code) 922, written instructions 924 (i.e., "Cut Here") and an associated cut line 926 that indicates where the user should cut the adhesive tape platform 900. The written instructions 924 and the cut line 926 typically are printed or otherwise marked on the top non-adhesive side 920 of the adhesive tape platform 900 during manufacture, for example, after the step of adding the flexible cover layer (FIG. 7, block 72). The two-dimensional bar code 922, on the other hand, may be marked on the non-adhesive side 920 of the adhesive tape platform 900 during the manufacture of the adhesive layer 918 or, alternatively, may be marked on the non-adhesive side 920 of the adhesive tape platform 900 as needed using, for example, a printer or other marking device.

In order to avoid damage to the functionality of the segments of the adhesive tape platform 900, the cut lines 926 typically demarcate the boundaries between adjacent segments at locations that are free of any active components of the wireless transducing circuit 914. The spacing between components of the wireless transducing circuit 914 and the cut lines 926 may vary depending on the intended communication, transducing, and/or adhesive taping application. In the example illustrated in FIG. 9A, the length of the adhesive tape platform 900 that is dispensed to seal the asset 901 corresponds to a single segment 913 of the adhesive tape platform 900. In other examples, the length of the adhesive tape platform 900 needed to seal an asset or otherwise serve the adhesive function for which the adhesive tape platform 900 is being applied may include multiple segments 913 of the adhesive tape platform 900, one or more of which segments 913 may be activated upon cutting the length of the adhesive tape platform 900 from the roll 916 and/or applying the length of the adhesive tape platform to the asset 901.

In some examples, components of the wireless transducing circuit 914 that are embedded in one or more segments 913 of the adhesive tape platform 900 are activated when the adhesive tape platform 900 is cut along the cut line 926. In these examples, the adhesive tape platform 900 includes one or more embedded energy sources (e.g., thin film batteries, which may be printed, or conventional cell batteries, such as conventional watch style batteries, rechargeable batteries, or other energy storage devices, such as a super capacitor or charge pump) that supply power to components of the wireless transducing circuit 914 in one or more segments of the adhesive tape platform 900 in response to being separated from the adhesive tape platform 900 (e.g., along the cut line 926).

In some examples, each segment 913 of the adhesive tape platform 900 includes its own respective energy source including energy harvesting elements that can harvest energy from the environment. In some of these examples, each energy source is configured to only supply power to the components in its respective adhesive tape platform segment regardless of the number of contiguous segments 913 that are in a given length of the adhesive tape platform 900. In other examples, when a given length of the adhesive tape platform 900 includes multiple segments 913, the energy sources in the respective segments 913 are configured to supply power to components of the wireless transducing circuit 914 in all of the segments 913 in the given length of the adhesive tape platform 900. In some of these examples, the energy sources are connected in parallel and concurrently activated to power components of the wireless transducing circuit 914 in all of the segments 913 at the same time. In other examples, the energy sources are connected in parallel and alternately activated to power components of the wireless transducing circuit 914 in respective ones of the adhesive tape platform segments 913 at different time periods, which may or may not overlap.

Figure 10:
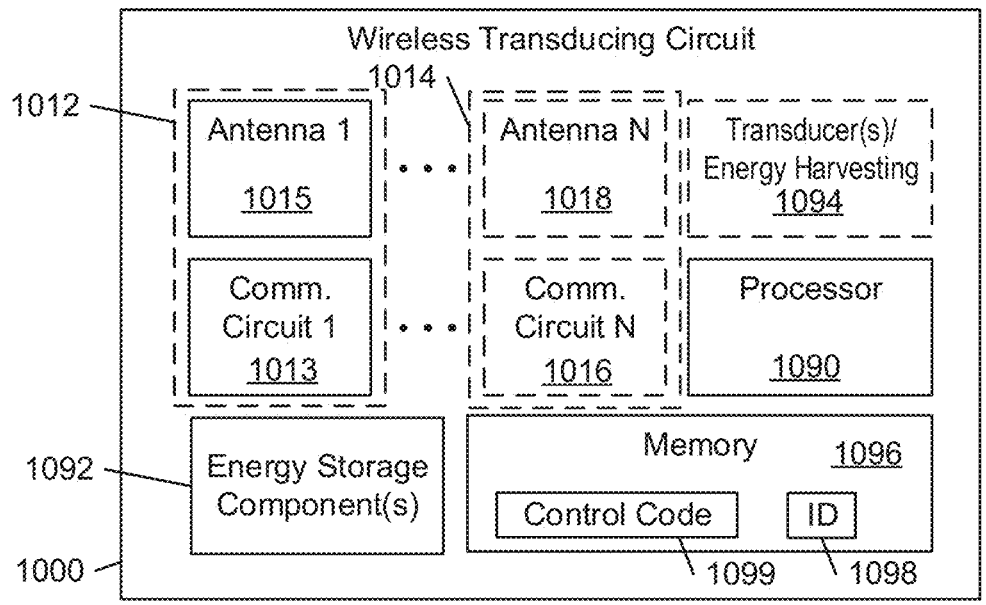
FIG. 10 is a schematic view of an example wireless transducer circuit, according to some embodiments.

FIG. 10 shows a block diagram of the components of an example wireless transducing circuit 1000 that includes a number of communication systems 1012, 1014. Wireless transducing circuit 1000 is an example of wireless transducing circuit 914, discussed above. Components of the wireless transducing circuit 1000 may be embodiments of the electronic components 18, 20 discussed above with respect to FIGS. 1-7. Example communication systems 1012, 1014 include a GPS system that includes a GPS receiver circuit 1013 (e.g., a receiver integrated circuit) and a GPS antenna 1015, and one or more wireless communication systems each of which includes a respective transceiver circuit 1016 (e.g., a transceiver integrated circuit) and a respective antenna 108. Example wireless communication systems include a cellular communication system (e.g., GSM/GPRS), a Wi-Fi communication system, an RF communication system (e.g., LoRa), a Bluetooth communication system (e.g., a Bluetooth Low Energy system), a Z-wave communication system, and a ZigBee communication system. The wireless transducing circuit 1000 also includes a processor 1090 (e.g., a microcontroller or microprocessor), one or more energy storage devices 1092 (e.g., non-rechargeable or rechargeable printed flexible battery, conventional single or multiple cell battery, and/or a supercapacitor or charge pump), one or more transducers 1094 (e.g., sensors and/or actuators, and, optionally, one or more energy harvesting transducer components). The one or more transducers 1094 includes at least one sensing transducer, according to some embodiment. In some examples, the conventional single or multiple cell battery may be a watch style disk or button cell battery that is associated electrical connection apparatus (e.g., a metal clip) that electrically connects the electrodes of the battery to contact pads on a flexible circuit. In some embodiments the energy storage 1092 is in the form of a flexible battery layer.

Examples of sensing transducers 1094 (also referred to herein as "sensors") include a capacitive sensor, an altimeter, a gyroscope, an accelerometer, a temperature sensor, a strain sensor, a pressure sensor, a piezoelectric sensor, a weight sensor, an optical or light sensor (e.g., a photodiode or a camera), an acoustic or sound sensor (e.g., a microphone), a smoke detector, a radioactivity sensor, a chemical sensor (e.g., an explosives detector), a biosensor (e.g., a blood glucose biosensor, odor detectors, antibody based pathogen, food, and water contaminant and toxin detectors, DNA detectors, microbial detectors, pregnancy detectors, and ozone detectors), a magnetic sensor, an electromagnetic field sensor, and a humidity sensor. Examples of actuating (e.g., energy emitting) transducers 1094 include light emitting components (e.g., light emitting diodes and displays), electro-acoustic transducers (e.g. audio speakers), electric motors, and thermal radiators (e.g., an electrical resistor or a thermoelectric cooler).

Figure 11:
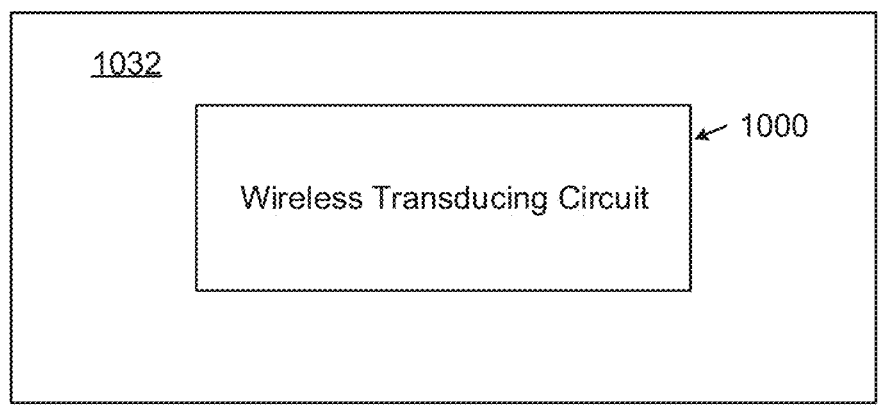
FIG. 11 is a diagrammatic top view of a length of an example autonomous agent platform containing an embedded wireless transducing circuit, according to some embodiments.

In some examples, the wireless transducing circuit 1000 includes a memory 1096 for storing data, including, e.g., profile data, state data, event data, sensor data, localization data, security data, and one or more unique identifiers (ID) 1098 associated with the wireless transducing circuit 1000, such as a product ID, a type ID, and a media access control (MAC) ID, and control code 1099. In some examples, the memory 1096 may be incorporated into one or more of the processor 1090 or transducers 1094, or may be a separate component that is integrated in the wireless transducing circuit 1000 as shown in FIG. 11. The control code typically is implemented as programmatic functions or program modules that control the operation of the wireless transducing circuit 1000, including a tape node communication manager that manages the manner and timing of tape node communications, a tape node power manager that manages power consumption, and a tape node connection manager that controls whether connections with other nodes are secure connections or unsecure connections, and a tape node storage manager that securely manages the local data storage on the node. The tape node connection manager ensures the level of security required by the end application and supports various encryption mechanisms. The tape node power manager and tape communication manager work together to optimize the battery consumption for data communication. In some examples, execution of the control code by the different types of tape nodes described herein may result in the performance of similar or different functions.

FIG. 11 is a top view of a generic platform 1032 for the wireless transducing circuit 1000, according to some embodiments. The platform (also referred to as a "tape node," herein) includes a respective set of the components of the wireless transducing circuit 100. The tape node 1032 may be fabricated according to the automated manufacturing process described above, with respect to FIGS. 1-6. In some embodiments, the tape node 1032 is a single segment of a flexible electronic device that has been cut from a roll gathering a larger length of the flexible electronic device (see FIG. 1). In some embodiments, multiple platforms contain respective sets of components that are identical and configured in the same way. In some other embodiments, however, multiple platforms contain respective sets of components that are different and/or configured in different ways. For example, different ones of the platforms 1032 have different sets or configurations of tracking and/or transducing components that are designed and/or optimized for different applications. Alternatively, different sets of segments of the platform 1032 may have different ornamentations (e.g., markings on the exterior surface of the platform) and/or different dimensions.

The details of specific implementations described herein may be specific to particular embodiments of particular inventions and should not be construed as limitations on the scope of any claimed invention. For example, features that are described in connection with separate embodiments may also be incorporated into a single embodiment, and features that are described in connection with a single embodiment may also be implemented in multiple separate embodiments. In addition, the disclosure of steps, tasks, operations, or processes being performed in a particular order does not necessarily require that those steps, tasks, operations, or processes be performed in the particular order; instead, in some cases, one or more of the disclosed steps, tasks, operations, and processes may be performed in a different order or in accordance with a multi-tasking schedule or in parallel.

Other embodiments are within the scope of the claims.

Additional Configuration Information

The foregoing description of the embodiments of the disclosure have been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method of manufacturing a flexible electronic device, comprising:
   placing a plurality of electronic components over a flexible substrate layer comprising electrical connections between the plurality of electronic components;
   receiving a set of profile heights of the plurality of electronic components;
   determining a set of additive layer thicknesses based on the set of profile heights, the set of additive layer thicknesses including a first thickness corresponding to a first flexible additive layer and a subsequent thickness corresponding to a subsequent flexible additive layer;
   positioning the first flexible additive layer comprising one or more apertures, wherein each of the plurality of electronic components are aligned in a respective aperture of the plurality of apertures;
   arranging the subsequent flexible additive layer comprising one or more apertures over the first flexible additive layer and aligning the one or more apertures around respective portions of one or more of the plurality of electronic components protruding above the first flexible additive layer; and
   emplacing a flexible cover layer over the subsequent flexible additive layer.

2. The method of claim 1, wherein the flexible electronic device comprises multiple electronic devices and further comprising performing the placing, the positioning, the arranging, and the emplacing sequentially for each of the multiple flexible electronic devices along a continuous length of the flexible substrate, the first flexible additive layer, the subsequent flexible additive layer, and the flexible cover layer.

3. The method of claim 2, wherein the method of manufacturing the flexible electronic device is implemented by a roll-to-roll process.

4. The method of claim 3, wherein the roll-to-roll process comprises:
   dispensing the flexible substrate layer from a roll;
   electrically connecting the plurality of components to the electrical connections of the flexible substrate layer;
   dispensing the first flexible additive layer from a roll;
   applying a compressive force between the first flexible additive layer and the flexible substrate layer as the first flexible additive layer is dispensed from the roll and positioned over the flexible substrate layer;
   dispensing the subsequent flexible additive layer from a roll;
   applying a compressive force between the subsequent flexible additive layer and the first flexible additive layer as the subsequent additive layer is dispensed from the roll and positioned over the first flexible additive layer;
   dispensing the flexible cover layer from a roll; and
   applying a compressive force between the flexible cover layer and the subsequent flexible additive layer as the flexible cover layer is dispensed from the roll and positioned over the subsequent flexible additive layer.

5. The method of claim 3, further comprising taking the flexible electronic device up into a roll after the emplacing the flexible cover layer over the subsequent flexible additive layer.

6. The method of claim 1, further comprising arranging one or more other successive flexible additive layers over the subsequent flexible additive layer, the one or more other successive flexible additive layers comprising one or more apertures aligned around respective portions of one or more of the plurality of electric components protruding above preceding ones of the flexible additive layers.

7. The method of claim 1, wherein the receiving the set of profile heights comprises receiving the set of profile heights from a computer aided design specification of the flexible electronic device.

8. The method of claim 1, wherein the determining the set of additive layer thicknesses is based on differences between thicknesses of pairs of the profile heights.

9. The method of claim 8, further comprising executing an evolutionary algorithm on the set of flexible additive layer thicknesses to determine an optimized stacking sequence of flexible additive layers between the flexible substrate and the flexible cover.

10. The method of claim 9, wherein the evolutionary algorithm comprises a genetic algorithm.

11. The method of claim 1, further comprising stamping apertures in the first flexible additive layer and the subsequent flexible additive layer.

12. The method of claim 1, further comprising dispensing adhesive on the flexible substrate and placing one or more of the plurality of electronic components on the adhesive.

13. The method of claim 1, further comprising laminating the first flexible additive layer and the subsequent flexible additive layer between the flexible substrate and the flexible cover.

14. The method of claim 1, wherein
a gap between a sidewall of one of the one or more apertures in the first flexible additive layer and a respective portion of one of the plurality of electronic components is less than or equal to 0.1 mm, and
a gap between a sidewall of one of the one or more apertures in the subsequent flexible additive layers and a portion of one of the one or more respective electrical components is less than or equal to 0.1 mm.

15. The method of claim 1, wherein a wiring layer is disposed between the flexible substrate and the first flexible additive layer, the wiring layer configured to electrically connect the plurality of electronic components.

16. The method of claim 15, wherein the plurality of electronic components comprises a battery operative to power one or more of the plurality of electronic components.

17. The method of claim 16, wherein the plurality of electronic components comprises a microcontroller, a wireless communications system, an antenna, and a sensor circuit.

18. The method of claim 17, wherein the microcontroller comprises one or more central processing units and a memory component.

19. The method of claim 17, wherein the wireless communications system comprises one or more wireless network communications interfaces.

20. The method of claim 1, further comprising:
prior to the emplacing the flexible cover layer, arranging a third flexible additive layer comprising one or more apertures over the first flexible additive layer and the subsequent flexible additive layer and aligning the one or more apertures around respective portions of one or more of the plurality of electronic components protruding above the first flexible additive layer and protruding above the subsequent flexible additive layer, wherein the set of additive layer thicknesses include a third thickness corresponding to the third flexible additive layer.

* * * * *